United States Patent [19]

Sun et al.

[11] Patent Number: 5,674,357
[45] Date of Patent: Oct. 7, 1997

[54] SEMICONDUCTOR SUBSTRATE CLEANING PROCESS

[75] Inventors: Yi-Lin Sun, Taipei; Ying-Chen Chao, Hsin-chu, both of Taiwan

[73] Assignee: Taiwan Semiconductor Manufacturing Company, Ltd., Hsin-chu, Taiwan

[21] Appl. No.: 521,454

[22] Filed: Aug. 30, 1995

[51] Int. Cl.⁶ .................................................. H01L 21/302
[52] U.S. Cl. ................ 156/659.11; 134/1.2; 156/643.1; 156/638.1
[58] Field of Search ............................ 156/659.11, 651.1, 156/638.1, 646.1, 643.1; 134/1.3; 216/67; 134/1.2

[56] References Cited

U.S. PATENT DOCUMENTS

| | | | |
|---|---|---|---|
| 3,920,483 | 11/1975 | Johnson, Jr. et al. | 156/3 |
| 4,749,640 | 6/1988 | Tremont et al. | 430/314 |
| 5,013,688 | 5/1991 | Yamazaki et al. | 437/210 |
| 5,089,441 | 2/1992 | Moslehi | 437/225 |
| 5,100,476 | 3/1992 | Mase et al. | 134/1 |
| 5,134,093 | 7/1992 | Onishi et al. | 156/643.1 |
| 5,252,181 | 10/1993 | Dutartre et al. | 156/651 |
| 5,277,751 | 1/1994 | Ogle | 156/643 |
| 5,378,317 | 1/1995 | Kashiwase et al. | 156/659.11 |

FOREIGN PATENT DOCUMENTS

| | | |
|---|---|---|
| 548596 | 6/1993 | European Pat. Off. |
| 06005559 | 1/1994 | Japan. |
| 06275580 | 9/1994 | Japan. |
| 06349786 | 12/1994 | Japan. |

OTHER PUBLICATIONS

"Ashing Without Acid: An Assessment of Modern Photoresist Strippers"; Loewenstein et al.; Proceedings of the Second International Symposium on Ultra–Clean Processing of Silicon Surfaces; abstract only; 1994, ISBN 9 033432625.

*Primary Examiner*—R. Bruce Breneman
*Assistant Examiner*—George Goudreau
*Attorney, Agent, or Firm*—George O. Saile; Stephen B. Ackerman; Alek P. Szecsy

[57] ABSTRACT

A method for removing particulate residues from semiconductor substrates. A semiconductor substrate is provided which has upon its surface a particulate residue. At minimum, either the semiconductor substrate or the particulate residue is susceptible to oxidation upon exposure to an oxygen containing plasma. The semiconductor substrate and the particulate residue are exposed to an oxygen plasma. The particulates are then rinsed from the surface of the semiconductor substrate with deionized water.

11 Claims, 4 Drawing Sheets

SEMICONDUCTOR SUBSTRATE CLEANING PROCESS

BACKGROUND OF THE INVENTION

1. Field of the Invention

The present invention relates generally to methods for cleaning semiconductor substrates. More particularly, the present invention relates to an oxygen plasma method for removing particulate residues from semiconductor substrate surfaces.

2. Description of Background Art

Integrated circuit devices are typically fabricated from semiconductor substrates upon and within whose surfaces are formed a plurality of active semiconductor regions containing transistors, resistors, diodes and other electrical circuit elements. These electrical circuit elements are typically interconnected internally and externally to the semiconductor substrate upon which they are formed through multiple conducting layers which are separated by multiple insulating layers.

Common to many of the processes through which active semiconductor regions, conducting layers and insulating layers are formed upon semiconductor substrates is the coincident or incidental formation of particulate residues. The formation of these particulate residues often occurs when a semiconductor substrate upon whose surface resides a friable or erodible coating is deliberately or incidently exposed to a semiconductor manufacturing process through which highly energetic species are present. Common semiconductor manufacturing processes through which highly energetic species are present include ion implantation processes and Reactive Ion Etch (RIE) processes.

Although the formation of particulate residues may not impede the semiconductor fabrication processes within which those particulate residues are formed, the particulate residues if allowed to remain upon the semiconductor substrates upon which they were formed may present significant problems in semiconductor fabrication processes subsequent to the semiconductor fabrication process in which they were formed. Such is the case, for example, when highly energetic processes such as ion implantation processes or Reactive Ion Etch (RIE) processes form particulate residues which are redeposited upon surfaces of patterned layers through which those ion implantation processes or Reactive Ion Etch (RIE) processes are practiced. In such circumstances, the redistributed particulate may act a mask which obscures underlying portions of a patterned semiconductor substrate desired to be exposed to the subsequent semiconductor processing operations.

It is thus often quite important in semiconductor manufacturing that particulates formed upon a semiconductor substrate within one semiconductor manufacturing process not be allowed to remain upon the semiconductor substrate through a subsequent semiconductor manufacturing process. Consequently, the efficient and complete removal of particulate residues from semiconductor substrates is a desirable goal which will often assure optimal levels of integrated circuit functionality and reliability. It is towards these goals that the present invention is directed.

Methods through which particulate residues may be removed from semiconductor substrates are well known in the art. Traditional methods include purely mechanical methods which involve physical force and abrasion to remove particles from semiconductor substrates. More contemporary methods involve chemical and physicochemical means to dissolve particulate residues from semiconductor substrates. Some methods utilize both chemical and mechanical means. Finally, although not directed towards removal of particulate residues, there are also known in the art methods through which Reactive Ion Etch (RIE) plasmas may be used to modify semiconductor substrate surfaces and remove residues from those surfaces prior to semiconductor processing operations upon those surfaces.

For example, Johnson, et al. in U.S. Pat. No. 3,920,483 describes a method whereby a patterned photoresist layer upon a semiconductor substrate is exposed to a Reactive Ion Etch (RIE) plasma oxidation process prior to implanting ions through that layer. The Reactive Ion Etch (RIE) oxidation process provides a photoresist mask of greater dimensional stability.

More pertinent to the present invention, however, are methods which employ Reactive Ion Etch (RIE) plasmas for cleaning of semiconductor substrates prior to semiconductor processing operations upon those substrates. Included in this category are: (1) the disclosure of Dutartre et al. in U.S. Pat. No. 5,252,181 (an argon plasm followed by a hydrogen plasma for cleaning semiconductor substrates prior to depositing epitaxial films), (2) the disclosure of Yamazaki et al. in U.S. Pat. No. 5,013,688 (an argon plasma for precleaning semiconductor leads and semiconductor substrates prior to depositing silicon nitride coatings on those substrates), and. (3) the disclosure of Moslehi in U.S. Pat. No. 5,089,441 (a germane plasma cleaning process incorporating hydrogen, hydrogen chloride or hydrogen bromide, and hydrogen fluoride for removing native oxides and metallic contaminants from semiconductor substrates).

Desirable in the art is a process whereby a Reactive Ion Etch (RIE) plasma may be utilized to assist in removal of particulate residues formed upon semiconductor substrates. Most desirable would be a Reactive Ion Etch (RIE) plasma method applicable to various types of semiconductor substrate surfaces and particulate residues formed within integrated circuit fabrications.

SUMMARY OF THE INVENTION

A first object of the present invention is to provide a simple Reactive Ion Etch (RIE) plasma method for removal of particulate residues from semiconductor substrate surfaces.

A second object of the present invention is to provide a Reactive Ion Etch (RIE) plasma method in accord with the first object of the present invention, which method is also readily manufacturable.

A third object of the present invention is to provide a Reactive Ion Etch (RIE) plasma method in accord with the first object and second object of the present invention, which method is also economical.

In accord with the objects of the present invention, a new Reactive Ion Etch (RIE) plasma method for removing particulate residues from the surfaces of semiconductor substrates is provided.

The method is practiced upon a semiconductor substrate surface having a particulate residue thereon where at minimum at least one of the semiconductor substrate or the particulate residue is susceptible to oxidation in an oxygen containing plasma. The oxidation will make the surface of the semiconductor substrate and/or the particulate residue more hydrophilic. The semiconductor substrate surface upon which resides the particulate residue is then exposed to an oxygen containing plasma. Subsequent to exposure to the oxygen containing plasma the particulate residue is rinsed from the semiconductor substrate with deionized water.

The method of the present invention is simple. The oxygen Reactive Ion Etch (RIE) plasma process and the deionized water rinse process are well known semiconductor manufacturing processes. Much is discussed in the art pertaining to the mechanisms through which semiconductor substrate surfaces and particulate residues may be affected by these processes. The semiconductor manufacturing process which results from successively applying these two processes to a semiconductor substrate is not complex.

The method of the present invention is readily manufacturable. The method of the present invention utilizes semiconductor manufacturing processes which are well known in the art of semiconductor manufacturing. The oxygen Reactive Ion Etch (RIE) plasma and the deionized water rinse processes which are used in practice of the present invention will typically also be utilized for other portions of the semiconductor manufacturing process into which the method of the present invention is incorporated.

The method of the present invention is economical. The method of the present invention exposes a semiconductor substrate upon whose surface resides a particulate residue to a short oxygen Reactive Ion Etch plasma and a short deionized water rinse. Under conditions where the process equipment employed in practice of the present invention may be utilized in other portions of the semiconductor manufacturing process within which the process of the present invention is incorporated, the costs associated with the present invention may be minimal. In any event, the costs associated with the present invention may be significantly offset by the gains in semiconductor yield, functionality and reliability that practice of the present invention may provide.

DESCRIPTION OF THE PREFERRED EMBODIMENTS

The present invention provides a simple, manufacturable and economical method for removing particulate residues from the surfaces of semiconductor substrates. The method of the present invention may be applied when at minimum either the particulate residue or the semiconductor substrate upon which resides the particulate residue is susceptible to becoming more hydrophilic through oxidation in an oxygen containing plasma. The method of the present invention provides semiconductor manufacturing process advantages relating to simplicity, manufacturability and economy. The process of the present invention does not rely upon mechanical forces for removal of particulate residues from semiconductor surfaces, nor does the method of the present invention rely upon harsh chemicals or reactive environments to remove particulate residues from semiconductor substrates through complete dissolution of those particulate residues.

The present invention may be practiced upon semiconductor substrates upon whose surfaces are found many varieties of particulate residues. As well, the semiconductor substrate surface upon which is practiced the present invention may also be formed from many materials and may have many different semiconductor devices and electrical circuits formed therein. The present invention may be practiced upon semiconductor substrates from which there are formed Dynamic Random Access Memory (DRAM) integrated circuit chips and Static Random Access Memory (SRAM) integrated circuit chips. In addition, the present invention may be practiced upon semiconductor substrates within which there are formed field effect transistors and semiconductor substrates within which there are formed bipolar transistors. The method of the present invention has broad applicability within integrated circuit fabrication.

Figure 1A:
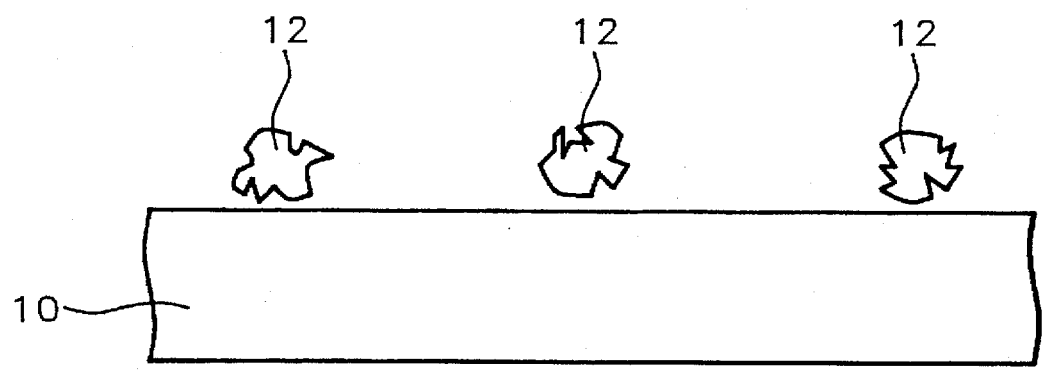
FIG. 1a to FIG. 1e show cross-sectional schematic diagrams illustrating a semiconductor substrate in accord with practice of the present invention.

Referring now to FIG. 1a to FIG. 1e there is shown a series of cross-sectional diagrams illustrating semiconductor substrates in accord with the preferred embodiment of the present invention. Shown in FIG. 1a is a cross-sectional diagram of a semiconductor substrate 10 upon whose surface resides particulates 12 forming a particulate residue which is desired to be removed through the method of the present invention. It is critical to the present invention that at minimum either the surface of the semiconductor substrate 10 or the surface of the particulates 12 be susceptible to oxidation in an oxygen containing plasma in a fashion whereby the particulates become more hydrophilic. If neither the particulates 12 nor the semiconductor substrate 10 are susceptible to oxidation through exposure to an oxygen containing plasma, the advantages of the present invention may not be realized.

There are several materials which when exposed to an oxygen plasma will undergo sufficient surface oxidation to provide for practice of the present invention. In general these materials will be materials which are not fully oxidized. Such materials may include but are not limited to organic functional glasses, oxides formed through low temperature Chemical Vapor Deposition (CVD) processes, metals, organic insulating films such as polyimides, and organic photoresist compositions. The present invention may be practiced under circumstances where at minimum either the particulates 12 or the semiconductor substrate 10 is formed from one of these materials. Preferably, the present invention may be practiced when at minimum either the particulates 12 or the semiconductor substrate 10 is formed from an organic coating. Most preferably, the present invention will be practiced when either the particulates 12 or the semiconductor substrate 10 is formed from a photoresist. Preferable photoresists are JSR-IX500, Sumitomo PFI26A, Sumitomo PFI-26A9 and Sumitomo PFI-38A9 photoresists.

It is not required for the present invention that both the semiconductor substrate 10 and the particulates 12 formed upon the semiconductor substrate 10 be formed from the same material. It is only required for the present invention that at minimum either the semiconductor substrate 10 or the particulates 12 be formed from a material susceptible to oxidation in an oxygen containing plasma. The greatest advantage in practice of the present invention will typically be realized in situations where both the particulates 12 and the semiconductor substrate 10 are formed from oxidizable materials.

Once there has been provided a semiconductor substrate and particulates 12 combination appropriate to the present invention, the next critical step in practice of the present invention may proceed. The next critical step in practice of the present invention is an oxygen containing plasma oxidation of the surfaces of the particulates 12 and/or the semiconductor substrate 10 to yield oxidized particulates and/or an oxidized semiconductor substrate. The results of this oxygen containing plasma oxidation process are shown in FIG. 1b to FIG. 1d.

Figure 1B:
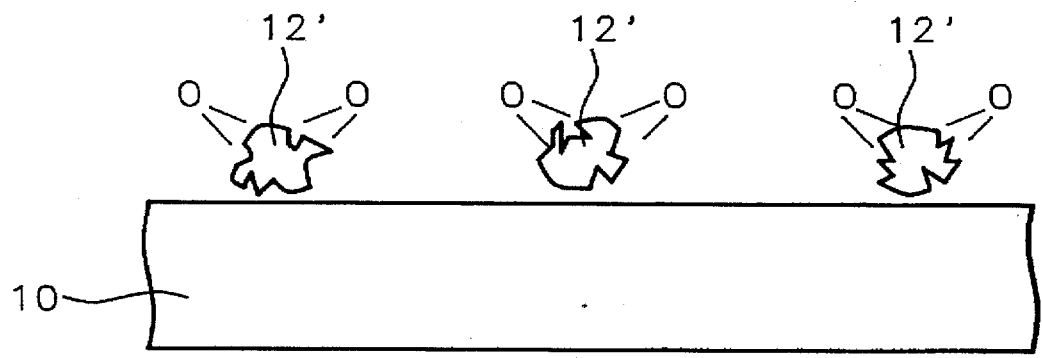
Figure 1C:
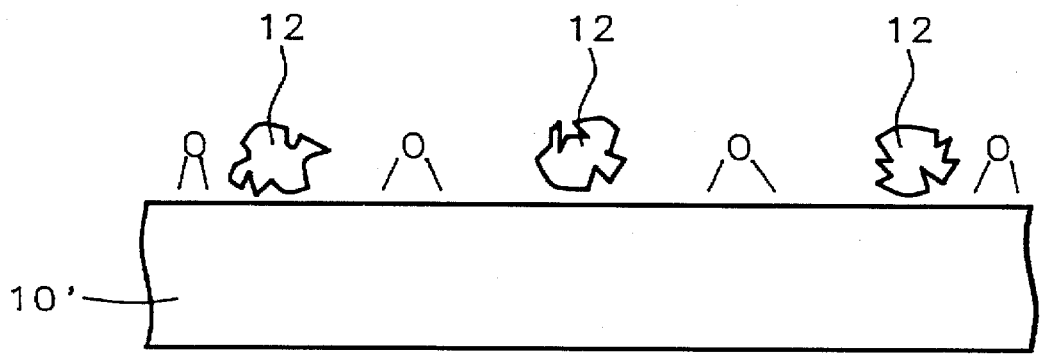
Figure 1D:
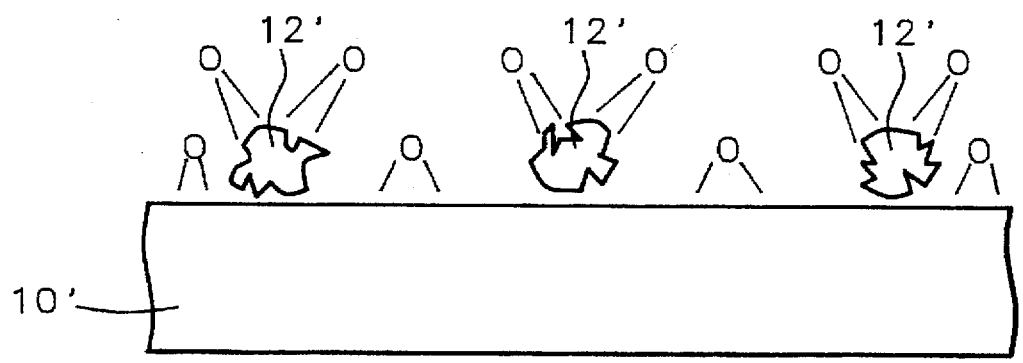

In FIG. 1b, there is shown a semiconductor substrate which has remained unchanged by the oxygen plasma oxidation. Upon its surface is shown oxidized particulates 12' which are formed from oxygen containing plasma oxidation of the particulates 12. The oxidized particulates 12' are illustrated with exposed surface oxygen species. In FIG. 1c, there is shown particulates 12 which remain unchanged by the oxygen containing plasma oxidation. The particulates 12 reside upon an oxidized semiconductor substrate 10' formed from oxygen containing plasma oxidation of the semiconductor substrate 10. The oxidized semiconductor substrate 10' is illustrated with exposed surface oxygen species. Finally, there is shown in FIG. 1d both oxidized particulates 12' and an oxidized semiconductor substrate 10'. Both are illustrated with exposed surface oxygen species.

The methods and materials through which oxygen containing plasma oxidation processes may be provided to semiconductor substrates which have upon their surfaces particulate residues are well known in the art. There are known in the art various reactor configurations through which the present invention may be practiced. There are also known in the art materials through oxygen containing plasmas may be formed. Typically, the oxygen containing plasma of the present invention will be formed from a plasma which contains either oxygen or ozone.

For the present invention it is preferred that the oxidation of the surface of the semiconductor substrate 10 and/or the particulates 12 be undertaken in an oxygen containing plasma which contains a minimum of 50 percent oxygen. It is preferred that the oxygen plasma of the present invention be formed at a radio frequency power of about 300 to about 700 watts, and that the semiconductor substrate 10 upon which resides the particulates 12 be exposed to the oxygen plasma for a time period of about 3 to about 180 seconds.

In order to achieve enhanced speeds of plasma reactions it is well known in the art that plasmas of many types may be concentrated through the use of magnetic fields. Such magnetic fields may be provided into plasma reaction chambers through placement of magnets into those chambers or by other means whereby a magnetic field may be formed and focused into the reaction chamber. While the rates of oxygen containing plasma oxidation processes of the present invention may also be increased through the use of magnetic assistance, the rates of the oxygen containing plasma oxidation typically observed for the present invention are sufficiently rapid such that incorporation of magnetic assistance may provide no practical advantage.

Once the surface of the semiconductor substrate 10 and/or the particulates 12 residing upon the semiconductor substrate 10 have been oxidized in an oxygen containing plasma, the second step of the present invention may proceed. Within the second step, there is provided a rinsing of the particulates 12 or the oxidized particulates 12' from the surface of the semiconductor substrate 10 or the oxidized semiconductor substrate 10'. The fashion by which water rinsing facilitates removal of these particulates is illustrated in FIG. 1e.

Figure 1E:
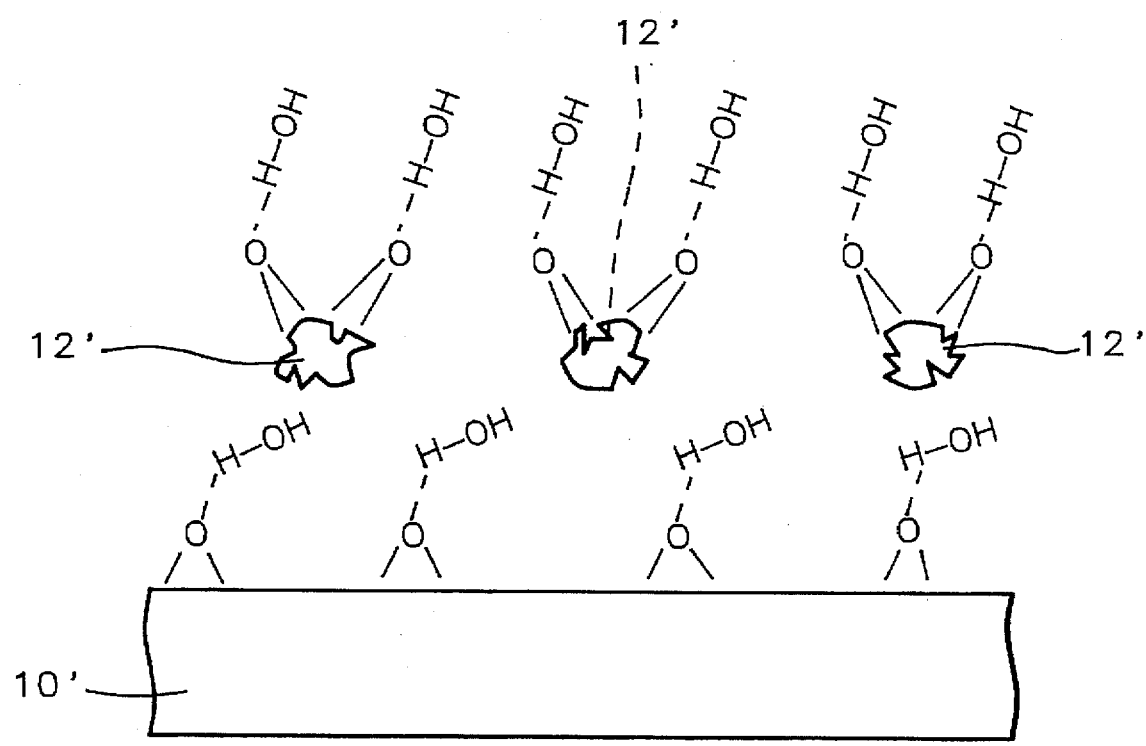

FIG. 1e follows from FIG. 1d. FIG. 1e illustrates an oxidized semiconductor substrate 10' whose surface oxygen species are now hydrated with water molecules. Also illustrated in FIG. 1e are oxidized particulates 12' whose surface oxygen species are also hydrated with water molecules. The strength of the attraction of the water molecules to the oxidized semiconductor substrate 10' and the oxidized particulates 12' is greater than the strength of the attraction of the oxidized particulates 12' to the oxidized semiconductor substrate 10'. Thus, the oxidized particulates are easily displaced from the surface of the oxidized semiconductor substrate 10'. A similar analysis may be provided when only either the semiconductor substrate 10 or the particulates 12 have been oxidized in the oxygen containing plasma. In such circumstances, the strength of attraction of water to the oxidized semiconductor substrate 10' or the oxidized particulates 12' outweighs the strength of the attraction of the particulates 12 or oxidized particulates 12' to the semiconductor substrate 10 or oxidized semiconductor substrate 10'.

Methods by which semiconductor substrates may be rinsed with water are common to the art. Such methods include but are not limited to direct immersion of semiconductor substrates into a static water bath and methods which employ additional energy imparted to the water which contacts the semiconductor substrate. Methods which employ additional energy include but are not limited to water spray methods, Quick Down Rinse (QDR) methods, ultrasonic agitation methods, megasonic agitation methods and elevated temperature methods. Also possible are methods whereby the hydrating forces of water are assisted by mechanical forces such as mild brushing and chemical agents such as surfactants. For semiconductor substrate rinsing techniques wherein the semiconductor substrate will be exposed to a static water bath wherein the particles removed from the semiconductor substrate will remain suspended in that static water bath, it is desirable to provide recirculating filtration within the static water bath in order to limit the possibility of redistribution of particles upon the surface of the semiconductor substrate.

For the present invention the preferred method through which the semiconductor substrate 10 or oxidized semiconductor substrate 10' is rinsed to remove the particulates 12 or oxidized particulates 12' is a water Quick Down Rinse (QDR) method followed by a spin-drying process as is common in the art to remove excess water from the surface of the semiconductor substrate. Upon drying of the semiconductor substrate there is provided a semiconductor substrate 10 or oxidized semiconductor substrate 10' whose surface possesses a substantially reduced quantity of particulate, as provided for by the present invention.

EXAMPLES 1–2

Figure 2A:
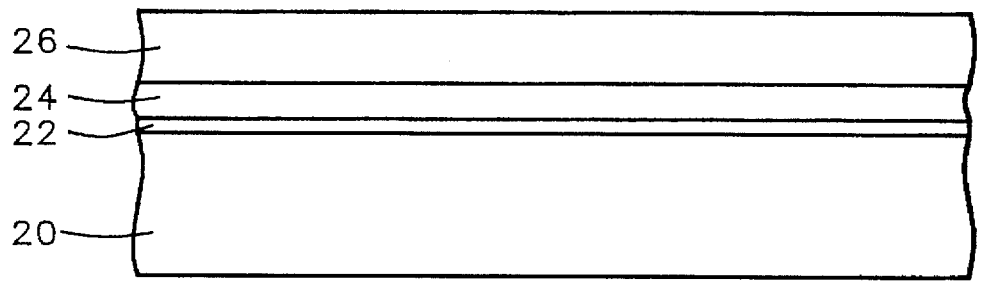
FIG. 2a to FIG. 2c show cross-sectional schematic diagrams illustrating a semiconductor substrate exposed to an ion implantation process subsequent to which has been incorporated the process of the present invention.

Upon the surfaces of a pair of semiconductor substrates was formed the tri-layer structure shown in FIG. 2a. FIG. 2a illustrates a semiconductor substrate 20 upon whose surface is formed an oxide layer 22, a polysilicon layer 24 and a photoresist layer 26. The semiconductor substrate 20 was a N- semiconductor substrate having a (100) crystallographic orientation. The oxide layer 22 was formed upon the semiconductor substrate 20 through thermal oxidation of the semiconductor substrate 20. The oxide layer 22 was about 150 angstroms thick. The polysilicon layer 24 was formed upon the oxide layer 22 through a Low Pressure Chemical Vapor Deposition (LPCVD) process using silane as the silicon source gas. The polysilicon layer 24 was formed upon the oxide layer 22 at a thickness of about 550 angstroms. Finally, the photoresist layer 26 was formed upon the surface of the polysilicon layer 24. The photoresist layer was formed from Sumitomo PFI-26A photoresist coated and cured upon the surface of the polysilicon layer at a thickness of about 1.13 microns.

Figure 2B:
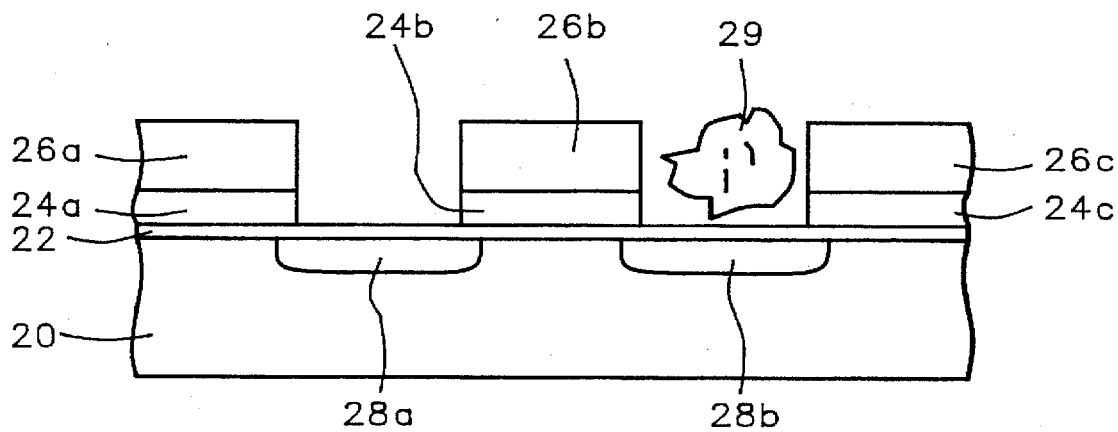

Once the tri-layer structure was formed upon the semiconductor substrate 20 as shown in FIG. 2a, the photoresist layer 26 and the underlying polysilicon layer 24 were patterned to yield the tri-layer structure shown in FIG. 2b. FIG. 2b shows patterned photoresist layers 26a, 26b and 26c residing upon patterned polysilicon layers 24a, 24b and 24c. The oxide layer 22 was not etched. The photoresist layer 26 was patterned and etched into the patterned photoresist layers 26a, 26b and 26c through exposure and development techniques as are known in the art. The width of the aperture between the patterned photoresist layers 26a and 26b, and patterned photoresist layers 26b and 26c was about 1 micron. The polysilicon layer 24 was etched to form patterned polysilicon layers 24a, 24b and 26c through a Reactive Ion Etch plasma mode process using chlorine and hydrogen bromide as the etchant gasses, and using as the etch mask the patterned photoresist layers 26a, 26b and 26c.

After the photoresist layer 26 was patterned to form the patterned photoresist layers 26a, 26b and 26c and the polysilicon layer 24 was patterned to form the patterned photoresist layers 24a, 24b and 24c, the semiconductor substrate 20 was exposed to an ion implantation process to form the active semiconductor regions 28a and 28b. The ion implantation process parameters were boron implanting ions at about 1E13 ions per square centimeter ion implantation dose and about 180 keV ion implantation energy. Under these conditions, the patterned photoresist layers 26a, 26b and 26c sustained damage which resulted in formation of a photoresist particulate residue which redeposited upon the surface of the semiconductor substrate 20. Shown in FIG. 2b is a photoresist particle 29 which redeposited into the aperture between patterned photoresist layers 26b and 26c.

One of the two semiconductor substrates was then subjected to the oxygen plasma/deionized water rinse process of the present invention. This semiconductor substrate was exposed to an oxygen plasma formed from 90% oxygen at an oxygen flow rate of about 2700 standard cubic centimeters per minute (sccm), a radio frequency power of about 500 watts and a reaction chamber pressure of about 2500 mTorr for a time period of about 28 seconds. The semiconductor substrate was then rinsed through exposure to four deionized water Quick Down Rinses (QDRs) for a total period of about 300 seconds and subsequently spun dry through a method conventional to the art. The semiconductor substrate so treated was then reunited with the semiconductor substrate which did not receive the oxygen plasma/ deionized water rinse process of the present invention. Both semiconductor substrates were treated equivalently for the remainder of their processing.

Figure 2C:
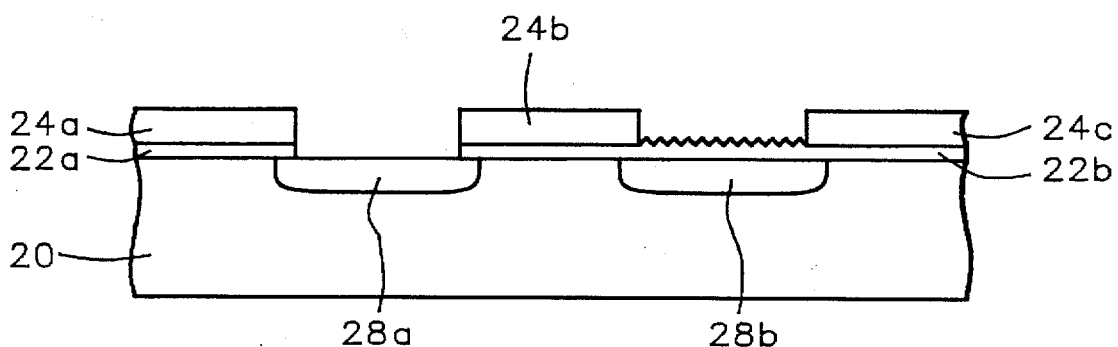

Both semiconductor substrates were then processed to yield the semiconductor structure illustrated in FIG. 2c. FIG. 2c illustrates the results of the sequential: (1) removal of the exposed portion of the oxide layer 22 to form the patterned oxide layers 22a and 22b, and (2) removal of the patterned photoresist layers 26a, 26b and 26c. The exposed portion of the oxide layer 22 was etched through a Reactive Ion Etch as is conventional in the art. Exposed portions of the oxide layer 22 upon which resided redistributed photoresist particulates, such as photoresist particle 29, were not effectively etched by the Reactive Ion Etch process. This is illustrated by the patterned oxide layer 22b which remains upon the surface of the active semiconductor region 28b between patterned polysilicon layers 24b and 24c. This portion of patterned oxide layer 22b formed an insulating layer which impeded electrical contact to the active semiconductor region 28b. The patterned photoresist layers 26a, 26b and 26c, and any redistributed photoresist particulate such as photoresist particle 29 which was formed upon ion implantation through the patterned photoresist layers 26a, 26b and 26c, were then removed through a process which was conventional to the art. The process included an oxygen plasma stripping of the patterned photoresist layers 26a, 26b and 26c and the redistributed photoresist particulate by means of exposure to an oxygen plasma maintained at about 500 watts for a time period of about three minutes. The oxygen plasma chamber was maintained at about 2500 mTorr with an oxygen flow rate of about 2700 standard cubic centimeters per minute (sccm). Following the oxygen plasma stripping was an acidic wet chemical etching, a deionized water rinsing and a spin drying of the semiconductor substrates.

After the semiconductor substrates were spun-dry, the surfaces of the semiconductor substrates were analyzed for defects, such as those within patterned oxide layer 22b, wherein an oxide layer was not completely removed from the surface of an active semiconductor region such as active semiconductor region 28b. These defects were detected through an arc lamp illumination and top-view inspection method which employed adjoining integrated circuit cells or integrated circuit die as comparison models. The results of this analysis indicated a total of 6600 defects for the semiconductor substrate which was not exposed to the oxygen plasma/deionized water rinse process of the present invention and a total of 620 defects for the semiconductor substrate which was exposed to the oxygen plasma/ deionized water rinse process of the present invention.

The results clearly show that the oxygen plasma/ deionized water rinse treatment of the present invention provides a semiconductor substrate which possesses fewer defects attributable to redistributed particulate, such as photoresist particles, on the surface of that semiconductor substrate.

EXAMPLES 3–4

Figure 3A:
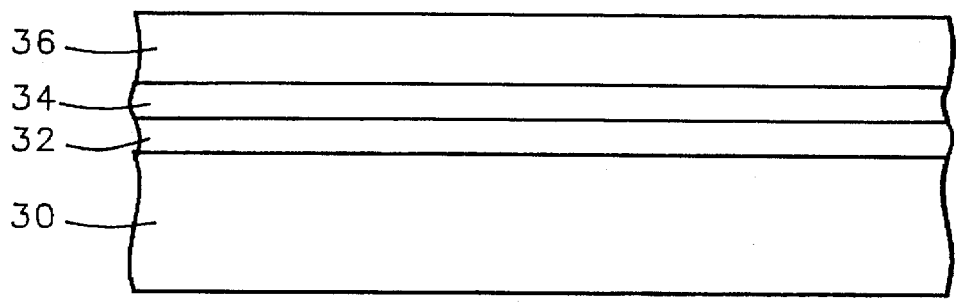
FIG. 3a to FIG. 3c show cross-sectional schematic diagrams illustrating a semiconductor substrate exposed to an oxide layer etching process subsequent to which has been incorporated the process of the present invention.

Upon the surfaces of a second pair of semiconductor substrates was formed the tri-layer structure shown in FIG. 3a. FIG. 3a shows a semiconductor substrate 30 upon whose surface there is formed a polysilicon layer 32, an oxide layer 34 and a photoresist layer 36. Similarly to EXAMPLES 1–2, the semiconductor substrates were N- silicon wafers with a (100) crystallographic orientation. The polysilicon layer 32 was formed upon the semiconductor substrate 30 through a Low Pressure Chemical Vapor Deposition (LPCVD) process employing silane as the silicon source material. The polysilicon layer 32 was about 2000 angstroms thick. The oxide layer 34 was formed upon the surface of the polysilicon layer 32 through a Low Pressure Chemical Vapor Deposition (LPCVD) process employing Tetra Ethyl Ortho Silicate as the oxide source material. The oxide layer 34 was about 2000 angstroms thick. The photoresist layer 36 was formed upon the surface of the oxide layer 34 from a Sumitomo PFI-26A photoresist at a thickness of about 1 micron.

Figure 3B:
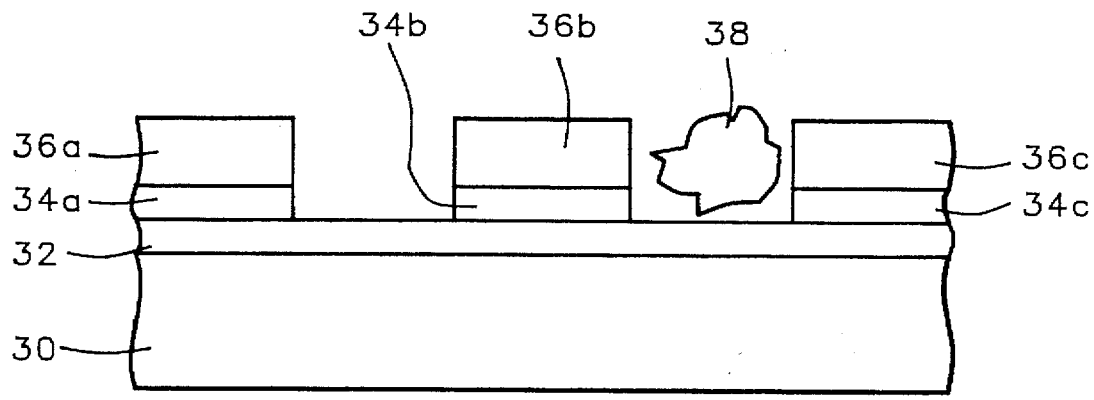

Similarly to EXAMPLES 1–2, the two wafers were then patterned to yield the patterned structure of FIG. 3b. FIG. 3b shows a patterning of the photoresist layer 36 to form the patterned photoresist layers 36a, 36b and 36c. In addition, FIG. 3b shows a patterning of the oxide layer 34 to form patterned oxide layers 34a, 34bb and 34c. The aperture between the patterned photoresist layers 36a and 36b and patterned photoresist layers 36b and 36c was about 1.7 microns. The photoresist layer 36 was patterned to form photoresist layers 36a, 36b and 36b through methods as are conventional in the art. The oxide layer 34 was patterned to form oxide layers 34a, 34b and 34c through a dry Reactive Ion Etch (RIE) process employing carbon tetra-fluoride or tri-fluoro methane as the etchant. Similarly to the fashion by which the ion implantation process employed in EXAMPLES 1–2 was sufficiently energetic to damage the patterned photoresist layers 26a, 26b and 26c, the Reactive Ion Etch (RIE) process employed for patterning oxide layer 34 into patterned oxide layers 34a, 34b and 34c was also sufficiently energetic to damage patterned photoresist layers 36a, 36b and 36c, or portions of the Reactive Ion Etch (RIE) process reactor chamber, causing the formation of photoresist particulate which redistributed upon the surface of the semiconductor substrate. A typical redistributed photoresist particle 38 is shown in FIG. 3b occupying the aperture between patterned photoresist layers 36b and 36c.

Similarly to EXAMPLES 1–2, one of the semiconductor substrates was exposed to the oxygen plasma/deionized water rinse process of the present invention. The other semiconductor substrate was not. The semiconductor substrate which was exposed to the oxygen plasma/deionized water rinse process received a treatment in accord with the process parameters outlined in EXAMPLES 1–2. The semiconductor substrates were then reunited.

Figure 3C:
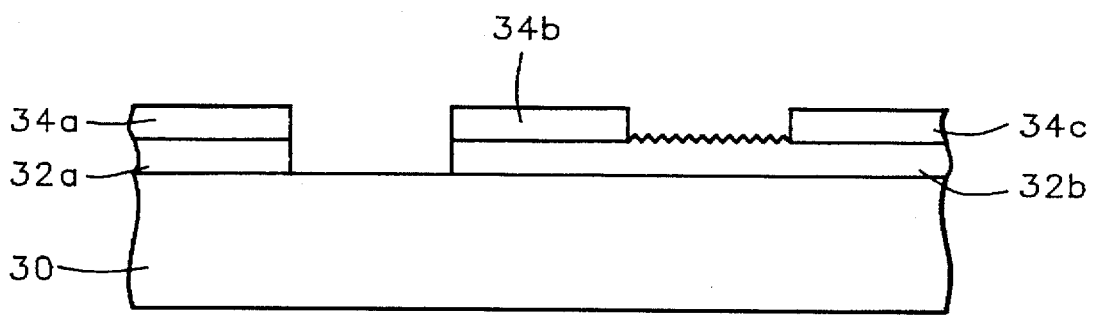

Both semiconductor substrates were then subjected to the remaining processes which yielded the semiconductor structure illustrated in FIG. 3c. The remaining processes included the successive: (1) etching of the polysilicon layer 32 to form the patterned polysilicon layers 32a and 32b, and (2) stripping of the photoresist layers 36a, 36b and 36c, and any redistributed particulate formed from damage to those photoresist layers resulting from the patterning of the oxide layer 34 into the patterned oxide layers 34a, 34b and 34c.

The polysilicon layer 32 was patterned into the patterned polysilicon layers 32a and 32b through etching with a Reactive Ion Etch plasma mode plasma process employing as the etchant gasses chlorine and hydrogen bromide. Similarly, to EXAMPLES 1–2, when a photoresist particle, such as photoresist particle 38, obscured a portion of the polysilicon layer 32 exposed through an opening in oxide layer 34, that portion of the polysilicon layer 32 was not etched. Within these EXAMPLES, the consequence of the presence of photoresist particle 38 within the aperture between patterned photoresist layers 36b and 36c was the incomplete etching of the patterned polysilicon layer 32b which resided beneath the photoresist particle. After the etching of the polysilicon layer 32 into the patterned polysilicon layers 32a and 32b, the photoresist stripping was accomplished through the same multi-step dry etch and wet etch process employed for EXAMPLES 1–2.

Analogously, to EXAMPLES 1–2, surface defects were also measured for these wafers using the same arc lamp illumination and top-view inspection method which employed adjoining integrated circuit cells or integrated circuit die as comparison models. For these EXAMPLES, the resulting defects were manifested as conductive polysilicon bridges to adjoining patterned polysilicon layers. The semiconductor substrate which was exposed to the oxygen plasma/deionized water rinse process of the present invention exhibited few defects. The semiconductor substrate which did not receive the oxygen plasma/deionized water rinse process of the present invention exhibited thousands of defects.

Similarly to EXAMPLES 1–2, the semiconductor substrates of EXAMPLES 3–4 also show that the oxygen plasma/deionized water rinse process of the present invention provides for substantial reductions in semiconductor substrate defects attributable to redistributed particulate, such as photoresist particles, upon the surfaces of semiconductor substrates.

What is claimed is:

1. A method for removing particulate residues from semiconductor substrates comprising:

providing a semiconductor substrate having a particulate residue formed thereover, the particulate residue being formed from a patterned layer also formed over the semiconductor substrate, a minimum of either the semiconductor substrate or the particulate residue being susceptible to oxidation in a plasma comprised of oxygen;

exposing the semiconductor substrate and the particulate residue to the plasma comprised of oxygen; and rinsing the particulate residue from the semiconductor substrate with deionized water, where the particulate residue is rinsed from the semiconductor substrate while the patterned layer remains upon the semiconductor substrate.

2. The method of claim 1 wherein the particulate residue is formed from an organic material.

3. The method of claim 2 wherein the organic material is a photoresist material.

4. The method of claim 1 wherein the plasma comprised of oxygen is formed from an oxygen containing plasma chosen from the group of oxygen containing plasmas consisting of oxygen plasmas containing at least 50 percent oxygen and ozone plasmas.

5. The method of claim 1 wherein the plasma comprised of oxygen contains at least 50 percent oxygen.

6. The method of claim 1 wherein the plasma comprised of oxygen is formed at a radio frequency power of 300 to 700 watts.

7. The method of claim 6 wherein the semiconductor substrate and the particulate residue are exposed to the plasma comprise oxygen for a time period of about 3 to about 180 seconds.

8. A method for removing an organic particulate residue from a semiconductor substrate comprising:

providing a semiconductor substrate having formed thereover an organic particulate residue, the organic particulate residue being formed from a patterned organic material layer also formed over the semiconductor substrate, a minimum of either the semiconductor substrate or the organic particulate residue being susceptible to oxidation in a plasma comprised of oxygen;

exposing the semiconductor substrate and the organic particulate residue to the plasma comprised of oxygen; and rinsing the organic particulate residue from the semiconductor substrate with deionized water, where the organic particulate residue is rinsed from the semiconductor substrate while the patterned organic material layer remains upon the semiconductor substrate.

9. The method of claim 8 wherein the plasma comprised of oxygen is formed from at least 50 percent oxygen at about 300 to 700 watts radio frequency power, the semiconductor substrate and the organic particulate residue being exposed to the oxygen containing plasma for about 3 to about 180 seconds.

10. A method for removing a photoresist particulate residue from a patterned photoresist coated semiconductor substrate comprising:

providing a semiconductor substrate having a patterned photoresist coating upon its surface and a photoresist particulate residue upon and within the patterns of the patterned photoresist coating, both the patterned photoresist coating and the photoresist particulate residue being susceptible to oxidation in a plasma comprised of oxygen;

exposing the patterned photoresist coating and the photoresist particulate residue to the plasma comprised of oxygen; and rinsing the photoresist particulate residue from upon and within the patterns of the patterned photoresist coating with deionized water, the patterned photoresist coating remaining upon the semiconductor substrate.

11. The method of claim 10 wherein the plasma comprised of oxygen is formed from at least 50 percent oxygen at about 300 to 700 watts radio frequency power, and the patterned photoresist coating and the photoresist particulate residue are exposed to the oxygen containing plasma for 3 to 180 seconds.

* * * * *